(12) United States Patent
Kwon et al.

(10) Patent No.: US 10,482,944 B2
(45) Date of Patent: Nov. 19, 2019

(54) SEMICONDUCTOR DEVICES

(71) Applicant: SK hynix Inc., Icheon-si, Gyeonggi-do (KR)

(72) Inventors: Kihun Kwon, Yongin-si (KR); Jaeil Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/947,467

(22) Filed: Apr. 6, 2018

(65) Prior Publication Data

US 2019/0088308 A1 Mar. 21, 2019

(30) Foreign Application Priority Data

Sep. 19, 2017 (KR) .................. 10-2017-0120184

(51) Int. Cl.
  *G11C 7/00* (2006.01)
  *G11C 11/406* (2006.01)
  *G11C 11/4096* (2006.01)
  *G11C 11/4093* (2006.01)
  *G11C 11/408* (2006.01)

(52) U.S. Cl.
  CPC .... *G11C 11/40607* (2013.01); *G11C 11/4082* (2013.01); *G11C 11/4093* (2013.01); *G11C 11/4096* (2013.01); *G11C 11/40615* (2013.01); *G11C 7/00* (2013.01)

(58) Field of Classification Search
  CPC .... G11C 7/1051; G11C 11/4074; G11C 5/147
  See application file for complete search history.

(56) References Cited

U.S. PATENT DOCUMENTS

| | | | | |
|---|---|---|---|---|
| 5,801,554 A | * | 9/1998 | Momma | G11C 7/1084 327/89 |
| 6,594,770 B1 | | 7/2003 | Sato et al. | |
| 2004/0240296 A1 | * | 12/2004 | Jeong | G11C 7/1072 365/222 |
| 2014/0003178 A1 | * | 1/2014 | Song | G11C 11/402 365/222 |
| 2014/0368241 A1 | * | 12/2014 | Ko | G11C 7/20 327/143 |

* cited by examiner

*Primary Examiner* — Uyen B Tran
(74) *Attorney, Agent, or Firm* — William Park & Associates Ltd.

(57) ABSTRACT

A semiconductor device includes an initial buffer signal generation circuit and a buffer signal generation circuit. The initial buffer signal generation circuit includes an initial buffer circuit which is activated if an initialization operation terminates. The initial buffer signal generation circuit generates an initial buffer signal from an external control signal in response to a first reference voltage signal. The buffer signal generation circuit includes a buffer circuit which is activated in response to the initial buffer signal. The buffer signal generation circuit generates a buffer signal from the external control signal in response to a second reference voltage signal.

27 Claims, 10 Drawing Sheets

SEMICONDUCTOR DEVICES

CROSS-REFERENCE TO RELATED APPLICATIONS

The present application claims priority under 35 U.S.C 119(a) to Korean Application No. 10-2017-0120184, filed on Sep. 19, 2017, which is herein incorporated by references in its entirety.

BACKGROUND

1. Technical Field

Embodiments of the present disclosure relate to semiconductor devices controlling buffers.

2. Related Art

Dynamic random access memory (DRAM) semiconductor devices may lose their stored data as time elapses even though power supply voltages are supplied to the DRAM, unlike static random access random (SRAM) devices and flash memory devices. This may be due to leakage currents of cell capacitors constituting memory cells of the DRAM devices together with cell transistors. Thus, the cell capacitors of the DRAM devices have to be periodically recharged to retain or refresh their stored data. The operation for recharging the cell capacitors may be referred to as a refresh operation. The refresh operation may be performed by activating a word line at least once within a data retention time of the memory cells to amplify the data stored in the memory cells. The data retention time may correspond to a maximum time that the cell capacitors can retain minimum charges which is required to reveal correct logic data without any refresh operations.

The refresh operations may be categorized as either an auto-refresh operation or a self-refresh operation. The auto-refresh operation may be executed by a refresh command outputted from a controller that controls the DRAM devices, and the self-refresh operation may be executed by counters included in the DRAM devices in a power down mode.

SUMMARY

Various embodiments are directed to semiconductor devices controlling buffers during an initialization operation and a refresh operation.

According to an embodiment, a semiconductor device includes an initial buffer signal generation circuit and a buffer signal generation circuit. The initial buffer signal generation circuit includes an initial buffer circuit which is activated if an initialization operation terminates. The initial buffer signal generation circuit generates an initial buffer signal from an external control signal in response to a first reference voltage signal. The buffer signal generation circuit includes a buffer circuit which is activated in response to the initial buffer signal. The buffer signal generation circuit generates a buffer signal from the external control signal in response to a second reference voltage signal.

According to yet another embodiment, a semiconductor device includes a buffer signal generation circuit and a command/address input control circuit. The buffer signal generation circuit includes a buffer circuit which is activated in response to an initial buffer signal which is generated by comparing an external control signal with a first reference voltage signal if an initialization operation terminates. The buffer signal generation circuit generates a buffer signal from the external control signal in response to a second reference voltage signal. The command/address input control circuit generates a command/address buffer activation signal for controlling activation or inactivation of a command/address buffer in response to the buffer signal.

According to still another embodiment, a semiconductor device includes an initial buffer signal generation circuit and a refresh control circuit. The initial buffer signal generation circuit includes an initial buffer circuit which is activated if an initialization operation terminates. The initial buffer signal generation circuit generates an initial buffer signal from an external control signal in response to a reference voltage signal. The refresh control circuit generates a refresh exit signal in response to the initial buffer signal and a refresh signal.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
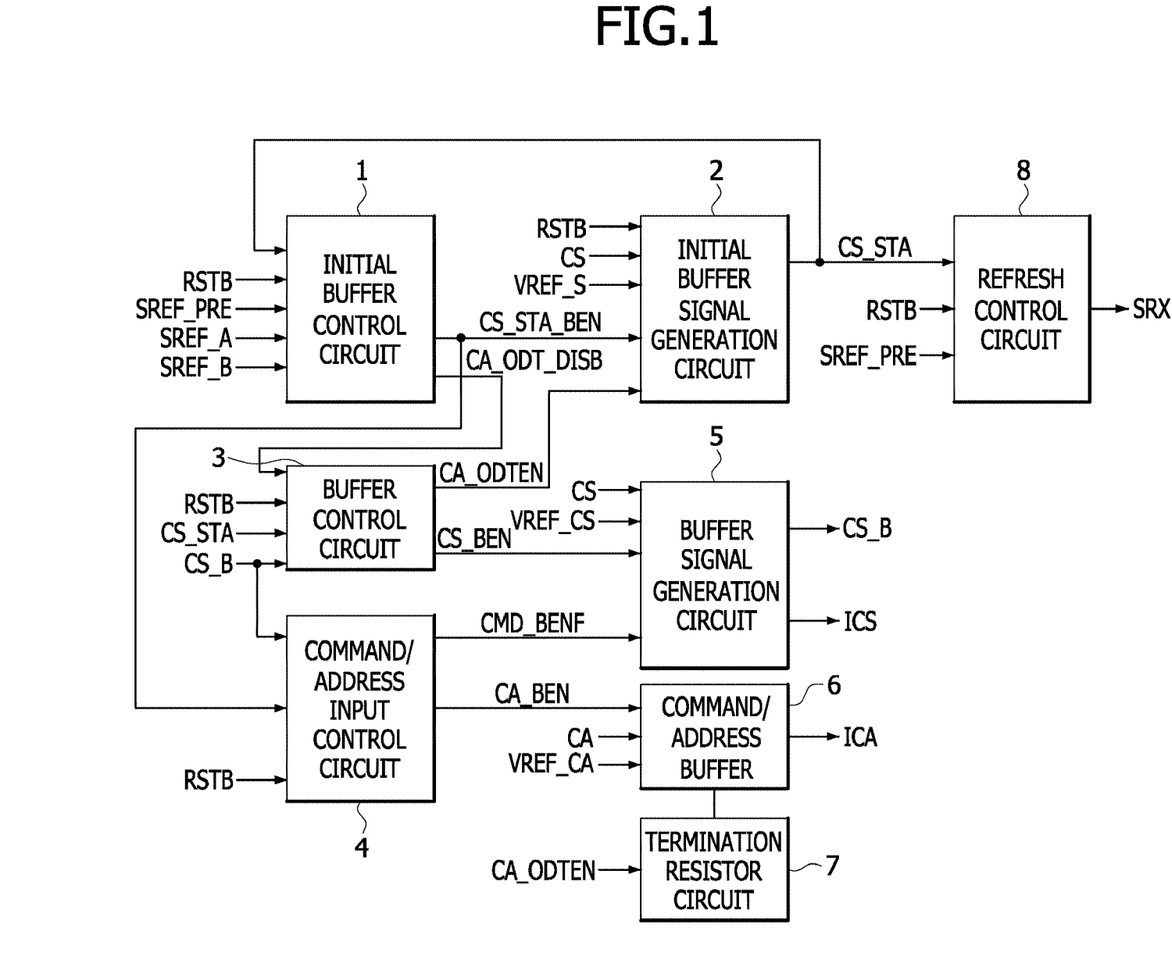
FIG. 1 is a block diagram illustrating a configuration of a semiconductor device according to an embodiment of the present disclosure.

As illustrated in FIG. 1, a semiconductor device according to an embodiment may include an initial buffer control circuit 1, an initial buffer signal generation circuit 2, a buffer control circuit 3, a command/address input control circuit 4, a buffer signal generation circuit 5, a command/address buffer 6, a termination resistor circuit 7, and a refresh control circuit 8.

The initial buffer control circuit 1 may generate an initial buffer activation signal CS_STA_BEN and a termination control signal CA_ODT_DISB in response to a reset signal RSTB, an initial buffer signal CS_STA, a refresh signal SREF_PRE, a first refresh pulse SREF_A, and a second refresh pulse SREF_B. The initial buffer control circuit 1 may generate an enabled initial buffer activation signal CS_STA_BEN in response to the reset signal RSTB if an initialization operation terminates. The initial buffer control circuit 1 may enable the initial buffer activation signal CS_STA_BEN to activate an initial buffer circuit (21 of FIG. 3). A logic level of an enabled initial buffer activation signal CS_STA_BEN may be set to be different by the initial buffer control circuit 1 according to the embodiment. The reset signal RSTB may be enabled to have a predetermined logic level during a time period that the initialization operation is performed by the initial buffer control circuit 1. A logic level of the reset signal RSTB, which is enabled, may be set to be different according to the embodiment. A logic level of the initial buffer signal CS_STA received by the initial buffer control circuit 1 may be determined according to a logic level of a chip selection signal CS after the initial buffer circuit (21 of FIG. 3) is activated. The initial buffer control circuit 1 may generate the termination control signal CA_ODT_DISB which is enabled if a refresh operation is performed in response to the refresh signal SREF_PRE, the first refresh pulse SREF_A, and the second refresh pulse SREF_B. A logic level of the termination control signal CA_ODT_DISB, which is enabled, may be set by the initial buffer control circuit 1 to be different according to the embodiment. The first and second refresh pulses SREF_A and SREF_B may be created in synchronization with a time that a refresh command for executing the refresh operation is inputted to the semiconductor device. The refresh signal SREF_PRE may be enabled to execute the refresh operation. In the present embodiment, the refresh operation may correspond to a self-refresh operation which is performed in a power-down mode. Times that the first and second refresh pulses SREF_A and SREF_B are created may be set to be different according to the embodiment. A logic level of the refresh signal SREF_PRE, which is enabled, may be set to be different according to the embodiments. A configuration and an operation of the initial buffer control circuit 1 will be described more fully with reference to FIG. 2 later.

The initial buffer signal generation circuit 2 may generate the initial buffer signal CS_STA in response to the reset signal RSTB, the chip selection signal CS, an initial reference voltage signal VREF_S, the initial buffer activation signal CS_STA_BEN, and a termination activation signal CA_ODTEN. The initial buffer signal generation circuit 2 may generate the initial buffer signal CS_STA having a first logic level if the chip selection signal CS has a level which is greater than or equal to a level of the initial reference voltage signal VREF_S while the initial buffer activation signal CS_STA_BEN is enabled after the initialization operation terminates. The chip selection signal CS may be an external control signal which is enabled to activate a chip including the semiconductor device. The initial reference voltage signal VREF_S may be generated to have half a power supply voltage level which is provided by an external device. The initial buffer signal generation circuit 2 may generate the initial buffer signal CS_STA having a second logic level if the initialization operation is performed or the termination activation signal CA_ODTEN is enabled. The first logic level of the initial buffer signal CS_STA may be set to be a logic "high" level, and the second logic level of the initial buffer signal CS_STA may be set to be a logic "low" level. The first and second logic levels of the initial buffer signal CS_STA may be set to be different according to the embodiment. A configuration and operation of the initial buffer signal generation circuit 2 will be described more fully with reference to FIG. 3 later.

The buffer control circuit 3 may generate the termination activation signal CA_ODTEN and a buffer activation signal CS_BEN in response to the reset signal RSTB, the initial buffer signal CS_STA, the termination control signal CA_ODT_DISB, and a buffer signal CS_B. The buffer control circuit 3 may generate the termination activation signal CA_ODTEN and the buffer activation signal CS_BEN which are disabled if the initialization operation is performed in response to reset signal RSTB. The buffer control circuit 3 may generate at least one of the termination activation signal CA_ODTEN and the buffer activation signal CS_BEN which are enabled in response to the initial buffer signal CS_STA if the chip selection signal CS has a level which is greater than or equal to a level of the initial reference voltage signal VREF_S while the initial buffer activation signal CS_STA_BEN is enabled. The buffer control circuit 3 may generate the termination activation signal CA_ODTEN and the buffer activation signal CS_BEN which are disabled if the chip selection signal CS has a level which is less than a level of the initial reference voltage signal VREF_S while the termination control signal CA_ODT_DISB is enabled and the buffer activation signal CS_BEN is enabled. The initial buffer signal CS_STA may have a logic "low" level if the chip selection signal CS has a lower level than a level of the initial reference voltage signal VREF_S. The termination activation signal CA_ODTEN may be enabled to activate the termination resistor circuit 7 connected to command/address buffer 6. A logic level of the termination activation signal CA_ODTEN, which is enabled, may be set to be different according to the embodiment. The buffer activation signal CS_BEN may be enabled to activate a buffer circuit (51 of FIG. 6). A logic level of the buffer activation signal CS_BEN output from the buffer control circuit 3, which is enabled, may be set to be different according to the embodiment. A configuration and an operation of the buffer control circuit 3 will be described more fully with reference to FIG. 4 later.

The command/address input control circuit 4 may generate a command buffer flag CMD_BENF and a command/address buffer activation signal CA_BEN in response to the reset signal RSTB, the buffer signal CS_B, and the initial buffer activation signal CS_STA_BEN. The command/address input control circuit 4 may generate the command buffer flag CMD_BENF and the command/address buffer activation signal CA_BEN which are disabled if the initialization operation is performed, in response to the reset signal RSTB. The command/address input control circuit 4 may generate the command buffer flag CMD_BENF and the command/address buffer activation signal CA_BEN which are respectively enabled at times that predetermined delay periods elapse from a time that the chip selection signal CS has a level which is greater than or equal to a level of a chip selection reference voltage signal VREF_CS after the initialization operation terminates and the initial buffer activation signal CS_STA_BEN is disabled. The command/address input control circuit 4 may output an enabled command buffer flag CMD_BENF to generate an internal command. The command/address input control circuit 4 may set a logic level of the command buffer flag CMD_BENF, which is enabled, to be different according to the embodiment. The command/address input control circuit 4 may generate the command/address buffer activation signal CA_BEN for controlling the activation or inactivation of the command/address buffer 6. For example, the command/address input control circuit 4 may enable the command/ address buffer activation signal CA_BEN to activate the command/address buffer 6. The command/address input control circuit 4 may set a logic level of the command/address buffer activation signal CA_BEN, which is enabled, to be different according to the embodiment. A configuration and an operation of the command/address input control circuit 4 will be described more fully with reference to FIG. 5 later.

The buffer signal generation circuit 5 may generate the buffer signal CS_B and an internal chip selection signal ICS in response to the chip selection signal CS, the chip selection reference voltage signal VREF_CS, the buffer activation signal CS_BEN, and the command buffer flag CMD_BENF. The buffer signal generation circuit 5 may compare the chip selection signal CS with the chip selection reference voltage signal VREF_CS to generate the buffer signal CS_B and the internal chip selection signal ICS while the buffer activation signal CS_BEN is enabled. The buffer signal generation circuit 5 may generate the buffer signal CS_B or the internal chip selection signal ICS having a first logic level if the chip selection signal CS has a level which is greater than or equal to a level of the chip selection reference voltage signal VREF_CS while the buffer activation signal CS_BEN is enabled. The buffer signal generation circuit 5 may set the chip selection reference voltage signal VREF_CS to the same level as the power supply voltage. The buffer signal generation circuit 5 may generate the buffer signal CS_B or the internal chip selection signal ICS having a second logic level if the chip selection signal CS has a lower level than a level of the chip selection reference voltage signal VREF_CS while the buffer activation signal CS_BEN is enabled. The first logic level may be set to a logic "high" level, and the second logic level may be set to a logic "low" level. The first and second logic levels of the buffer signal CS_B or the internal chip selection signal ICS may be set to be different according to the embodiment. The buffer signal generation circuit 5 may generate the buffer signal CS_B from a comparison result of the chip selection reference voltage signal VREF_CS and the chip selection signal CS while the command buffer flag CMD_BENF is disabled. The buffer signal generation circuit 5 may generate the internal chip selection signal ICS from a comparison result of the chip selection reference voltage signal VREF_CS and the chip selection signal CS while the command buffer flag CMD_BENF is enabled. A configuration and an operation of the buffer signal generation circuit 5 will be described more fully with reference to FIG. 6 later.

The command/address buffer 6 may generate an internal command/address ICA in response to the command/address buffer activation signal CA_BEN, a command/address CA, and a command/address reference voltage signal VREF_CA. The command/address buffer 6 may buffer the command/address CA to generate the internal command/address ICA, in response to the command/address reference voltage signal VREF_CA while the command/address buffer activation signal CA_BEN is enabled. The command/address buffer 6 may generate the internal command/address ICA having a first logic level if the command/address CA has a level which is greater than or equal to a level of the command/address reference voltage signal VREF_CA while the command/address buffer activation signal CA_BEN is enabled. The command/address buffer 6 may generate the internal command/address ICA having a second logic level if the command/address CA has a lower level than a level of the command/address reference voltage signal VREF_CA while the command/address buffer activation signal CA_BEN is enabled. The command/address buffer 6 may set the first logic level to be a logic "high" level, and may set the second logic level to a logic "low" level. The command/address buffer 6 may set the first and second logic levels of the internal command/address ICA may to be different according to the embodiment.

The termination resistor circuit 7 may be connected to the command/address buffer 6, and activation or inactivation of the termination resistor circuit 7 may be determined by the termination activation signal CA_ODTEN inputted to the termination resistor circuit 7. The termination resistor circuit 7 may be activated to control the command/address buffer 6 so that the command/address buffer 6 receives the command/address CA without any distortion of the command/address CA, if the termination activation signal CA_ODTEN is enabled.

The refresh control circuit 8 may generate a refresh exit signal SRX in response to at least one of the initial buffer signal CS_STA, the reset signal RSTB, and the refresh signal SREF_PRE. The refresh control circuit 8 may generate the refresh exit signal SRX which is disabled if the initialization operation is performed, in response to the reset signal RSTB. The refresh control circuit 8 may generate the refresh exit signal SRX which is disabled while the refresh signal SREF_PRE is disabled so that the refresh operation is not performed. The refresh control circuit 8 may generate the refresh exit signal SRX which is enabled if the chip selection signal CS has a level which is greater than or equal to a level of the initial reference voltage signal VREF_S while the refresh signal SREF_PRE is enabled to perform the refresh operation. The refresh control circuit 8 may set a logic level of the refresh exit signal SRX, which is enabled, according to the embodiment. A configuration and an operation of the refresh control circuit 8 will be described more fully with reference to FIG. 7 later.

Figure 2:
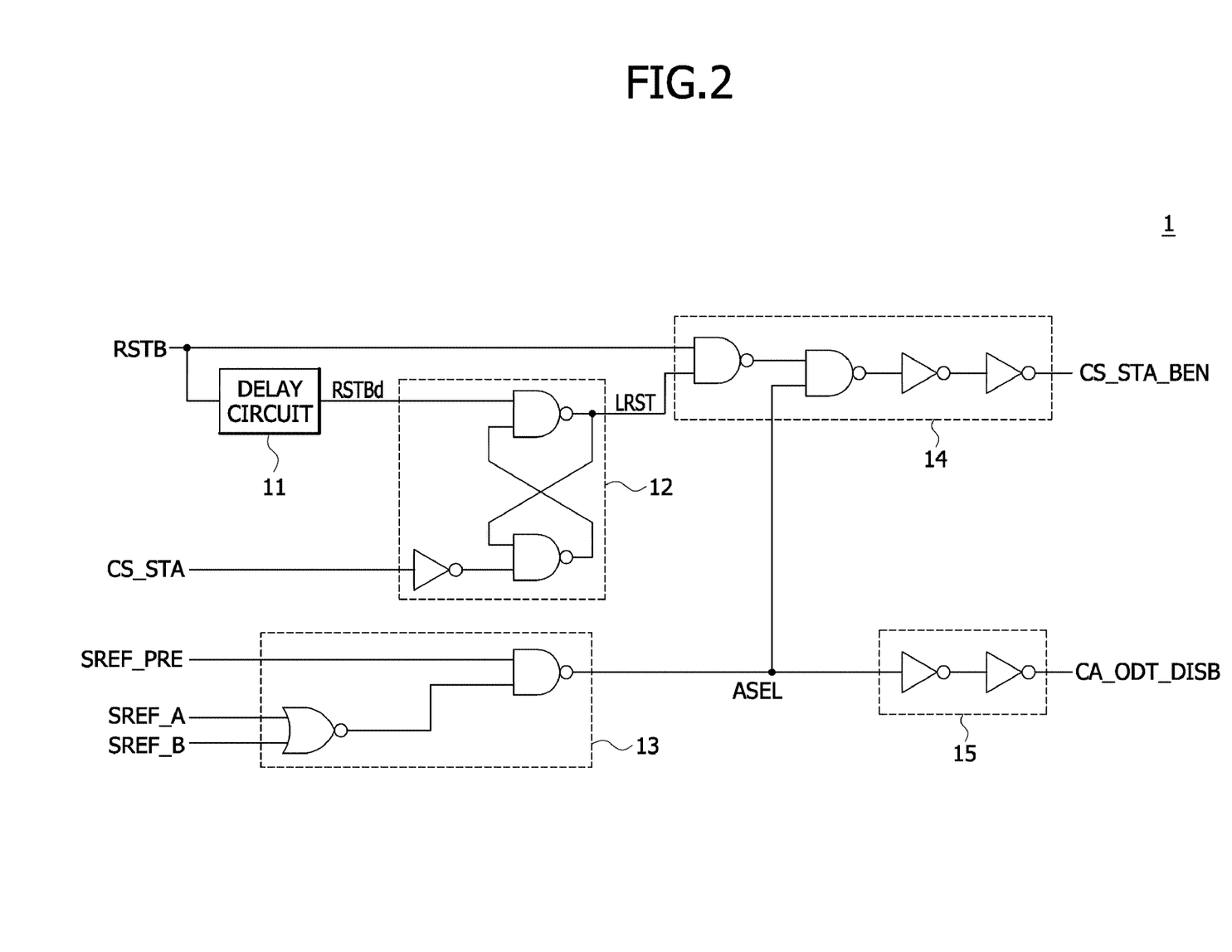
FIG. 2 is a circuit diagram illustrating an example of an initial buffer control circuit included in the semiconductor device of FIG. 1.

Referring to FIG. 2, the initial buffer control circuit 1 may include a delay circuit 11, a latch reset signal generation circuit 12, an activation selection signal generation circuit 13, an initial buffer activation signal output circuit 14, and a termination control signal output circuit 15. The delay circuit 11 may delay the reset signal RSTB by a predetermined delay period to generate a delayed reset signal RSTBd. The latch reset signal generation circuit 12 may generate a latched reset signal LRST in response to the delayed reset signal RSTBd and the initial buffer signal CS_STA. The latch reset signal generation circuit 12 may generate the latched reset signal LRST having a logic "high" level if the delayed reset signal RSTBd is enabled to have a logic "low" level. The latch reset signal generation circuit 12 may generate the latched reset signal LRST having a logic "low" level if the initial buffer signal CS_STA has a logic "high" level. The first and second refresh pulses SREF_A and SREF_B may possibly not be created and the refresh signal SREF_PRE may be disabled to have a logic "low" level, if the refresh operation is not performed. In such a case, the activation selection signal generation circuit 13 may generate an activation selection signal ASEL having a logic "high" level. The activation selection signal generation circuit 13 may generate the activation selection signal ASEL having a logic "low" level while the refresh signal SREF_PRE is enabled after the first or second refresh pulse SREF_A or SREF_B is created by execution of the refresh operation. The initial buffer activation signal output circuit 14 may generate the initial buffer activation signal CS_STA_BEN in response to the reset signal RSTB, the latched reset signal LRST, and the activation selection signal ASEL. The initial buffer activation signal output circuit 14 may receive the reset signal RSTB having a logic "high" level and the latched reset signal LRST having a logic "high" level to generate the initial buffer activation signal CS_STA_BEN which is enabled to have a logic "high" level, if the initialization operation terminates while the activation selection signal ASEL having a logic "high" level is inputted to the initial buffer activation signal output circuit 14 without execution of the refresh operation. The termination control signal output circuit 15 may buffer the activation selection signal ASEL to generate the termination control signal CA_ODT_DISB.

The initial buffer control circuit 1 may generate the initial buffer activation signal CS_STA_BEN which is disabled to have a logic "low" level during a period that the initialization operation is performed. The initial buffer control circuit 1 may generate the initial buffer activation signal CS_STA_BEN which is enabled to have a logic "high" level if the initialization operation terminates while the refresh operation is not performed. The initial buffer control circuit 1 may generate the termination control signal CA_ODT_DISB which is enabled to have a logic "low" level if the refresh operation is performed.

Figure 3:
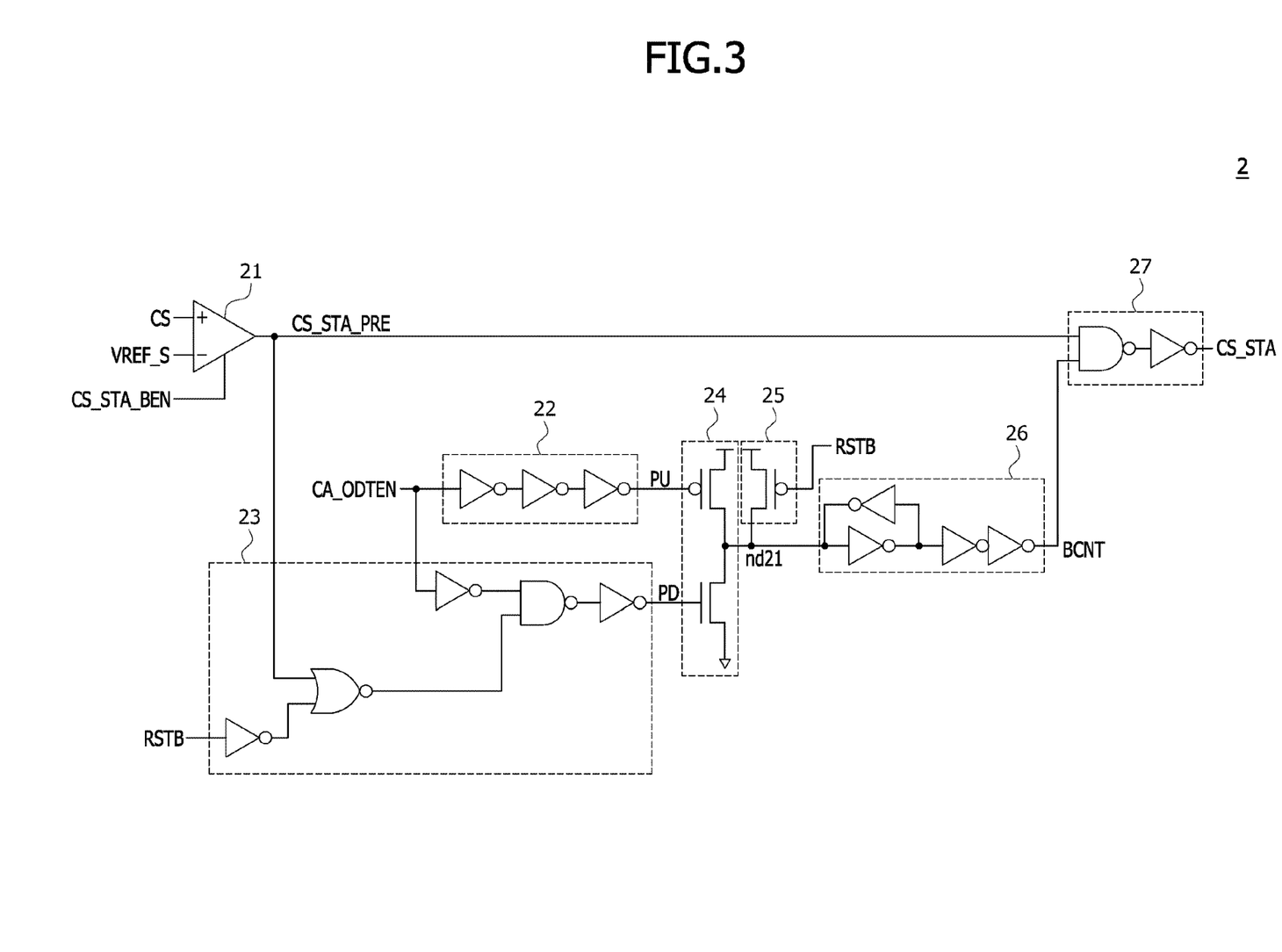
FIG. 3 is a circuit diagram illustrating an example of an initial buffer signal generation circuit included in the semiconductor device of FIG. 1.

Referring to FIG. 3, the initial buffer signal generation circuit 2 may include an initial buffer circuit 21, a pull-up signal generation circuit 22, a pull-down signal generation circuit 23, a drive circuit 24, an initialization circuit 25, a buffer control signal generation circuit 26, and an initial buffer signal output circuit 27. The initial buffer circuit may compare the chip selection signal CS with the initial reference voltage signal VREF_S to generate a pre-initial buffer signal CS_STA_PRE if the initial buffer activation signal CS_STA_BEN is enabled to have a logic "high" level. The initial buffer circuit 21 may generate the pre-initial buffer signal CS_STA_PRE having a logic "high" level if the chip selection signal CS has a level which is greater than or equal to a level of the initial reference voltage signal VREF_S. The initial buffer circuit 21 may generate the pre-initial buffer signal CS_STA_PRE having a logic "low" level if the chip selection signal CS has a level which is less than a level of the initial reference voltage signal VREF_S. The pull-up signal generation circuit 22 may buffer the termination activation signal CA_ODTEN to generate a pull-up signal PU. The pull-up signal generation circuit 22 may generate the pull-up signal PU which is enabled to have a logic "low" level if the termination activation signal CA_ODTEN inputted to the pull-up signal generation circuit 22 is enabled to have a logic "high" level. The pull-down signal generation circuit 23 may generate a pull-down signal PD in response to the pre-initial buffer signal CS_STA_PRE, the reset signal RSTB and the termination activation signal CA_ODTEN. The pull-down signal generation circuit 23 may generate the pull-down signal PD which is enabled to have a logic "high" level if the pre-initial buffer signal CS_STA_PRE has a logic "low" level, the reset signal RSTB is disabled to have a logic "high" level, and the termination activation signal CA_ODTEN is disabled to have a logic "low" level. The drive circuit 24 may drive a node nd21 in response to the pull-up signal PU and the pull-down signal PD. Accordingly, the drive circuit 24 may drive the node nd21 in response to the reset signal RSTB and the termination activation signal CA_ODTEN. The drive circuit 24 may pull up the node nd21 to a logic "high" level if the pull-up signal PU is enabled to have a logic "low" level. The drive circuit 24 may pull down the node nd21 to a logic "low" level if the pull-down signal PD is enabled to have a logic "high" level. The initialization circuit 25 may initialize a level of the node nd21 in response to the reset signal RSTB. The initialization circuit 25 may initialize a level of the node nd21 to a logic "high" level if the reset signal RSTB is enabled to have a logic "low" level. The buffer control signal generation circuit 26 may latch and inversely buffer a signal of the node nd21 to output the inversely buffered signal of the node nd21 as a buffer control signal BCNT. The initial buffer signal output circuit 27 may generate the initial buffer signal CS_STA in response to the pre-initial buffer signal CS_STA_PRE and the buffer control signal BCNT. The initial buffer signal output circuit 27 may generate the initial buffer signal CS_STA which is enabled to have a logic "high" level if both of the pre-initial buffer signal CS_STA_PRE and the buffer control signal BCNT have a logic "high" level. Further, the buffer control signal generation circuit 26 may enable the buffer control signal BCNT if both the reset signal RSTB and the termination activation signal CA_ODTEN are disabled.

The initial buffer signal generation circuit 2 may generate the initial buffer signal CS_STA having a logic "high" level if the chip selection signal CS has a level which is greater than or equal to a level of the initial reference voltage signal VREF_S while the initial buffer activation signal CS_STA_BEN is enabled to have a logic "high" level if the initialization operation terminates. In one example, the initial buffer signal generation circuit 2 may inactivate the initial buffer circuit 21 when the initial buffer signal CS_STA has a logic "high" level. The initial buffer signal generation circuit 2 may generate the initial buffer signal CS_STA having a logic "low" level if the termination activation signal CA_ODTEN is enabled to have a logic "high" level or the reset signal RSTB is enabled to have a logic "low" level for execution of the initialization operation.

Figure 4:
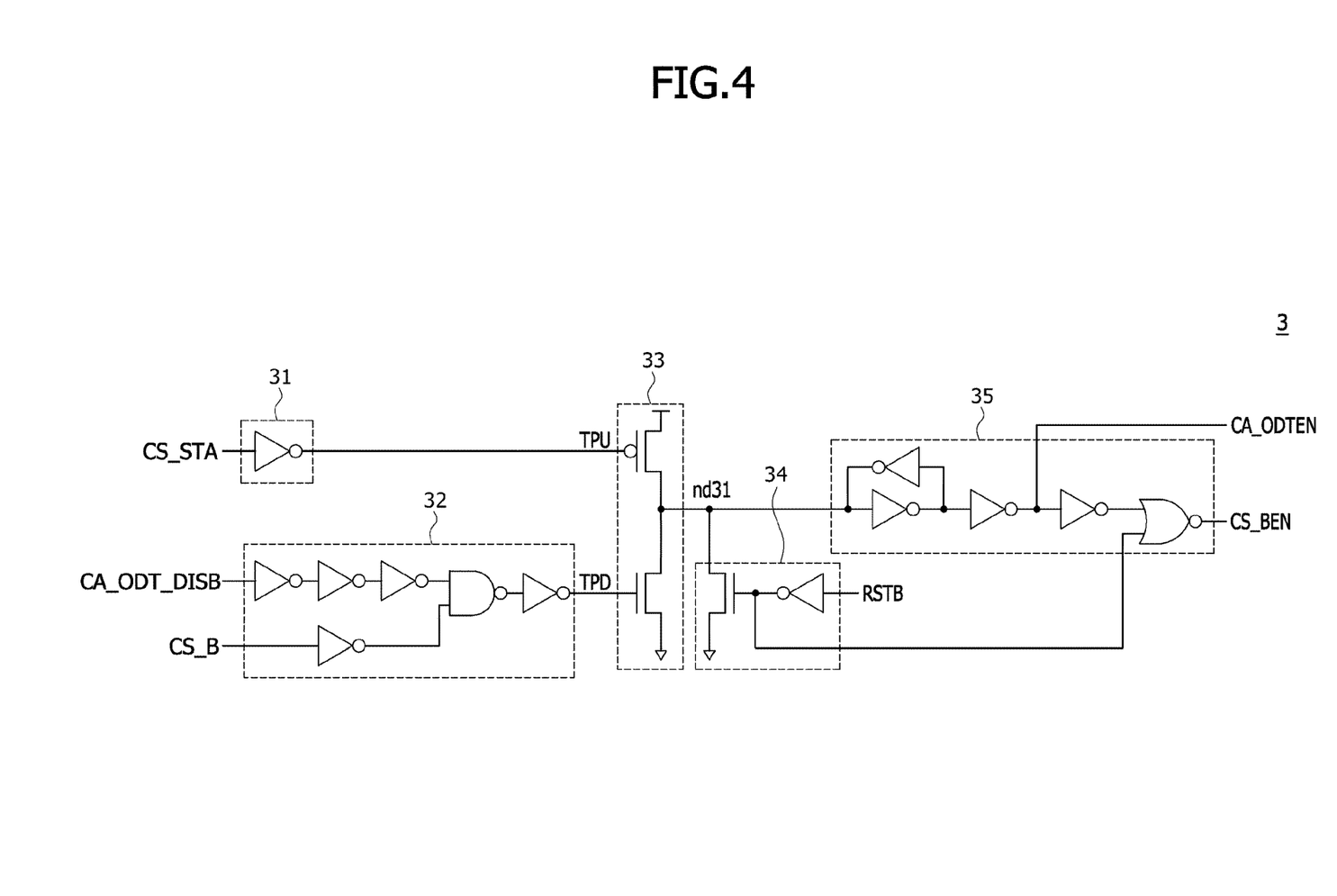
FIG. 4 is a circuit diagram illustrating an example of a buffer control circuit included in the semiconductor device of FIG. 1.

Referring to FIG. 4, the buffer control circuit 3 may include a buffer pull-up signal generation circuit 31, a buffer pull-down signal generation circuit 32, a buffer drive circuit 33, a buffer initialization circuit 34, and a buffer latch circuit 35. The buffer pull-up signal generation circuit 31 may inversely buffer the initial buffer signal CS_STA to generate a buffer pull-up signal TPU. The buffer pull-up signal generation circuit 31 may generate the buffer pull-up signal TPU which is enabled to have a logic "low" level if the initial buffer signal CS_STA has a logic "high" level. The buffer pull-down signal generation circuit 32 may generate a buffer pull-down signal TPD in response to the termination control signal CA_ODT_DISB and the buffer signal CS_B. The buffer pull-down signal generation circuit 32 may generate the buffer pull-down signal TPD which is enabled to have a logic "high" level if the termination control signal CA_ODT_DISB is enabled to have a logic "low" level and the buffer signal CS_B has a logic "low" level. The buffer drive circuit 33 may drive a node nd31 in response to the buffer pull-up signal TPU and the buffer pull-down signal TPD. The buffer drive circuit 33 may pull up a level of the node nd31 to a logic "high" level if the buffer pull-up signal TPU is enabled to have a logic "low" level. The buffer drive circuit 33 may pull down a level of the node nd31 to a logic "low" level if the buffer pull-down signal TPD is enabled to have a logic "high" level. The buffer initialization circuit 34 may initialize the node nd31 in response to the reset signal RSTB. The buffer initialization circuit 34 may initialize a level of the node nd31 to a logic "low" level if the reset signal RSTB is enabled to have a logic "low" level. The buffer latch circuit 35 may latch and buffer a signal of the node nd31 in response to the reset signal RSTB to generate the termination activation signal CA_ODTEN and the buffer activation signal CS_BEN. The buffer latch circuit 35 may generate the termination activation signal CA_ODTEN which is enabled to have a logic "high" level if a signal of the node nd31 has a logic "high" level. The buffer latch circuit 35 may generate the buffer activation signal CS_BEN which is enabled to have a logic "high" level if a signal of the node nd31 has a logic "high" level while the reset signal has a logic "high" level as the initialization operation terminates.

The buffer control circuit 3 may generate the termination activation signal CA_ODTEN and the buffer activation signal CS_BEN which are disabled to have a logic "low" level if the initialization operation is performed. The buffer control circuit 3 may generate the termination activation signal CA_ODTEN and the buffer activation signal CS_BEN which are enabled to have a logic "high" level if the initial buffer signal CS_STA has a logic "high" level as the initialization operation terminates. The buffer control circuit 3 may generate the termination activation signal CA_ODTEN and the buffer activation signal CS_BEN which are disabled to have a logic "low" level if the termination control signal CA_ODT_DISB is enabled to have a logic "low" level and the buffer signal CS_B has a logic "low" level.

Figure 5:
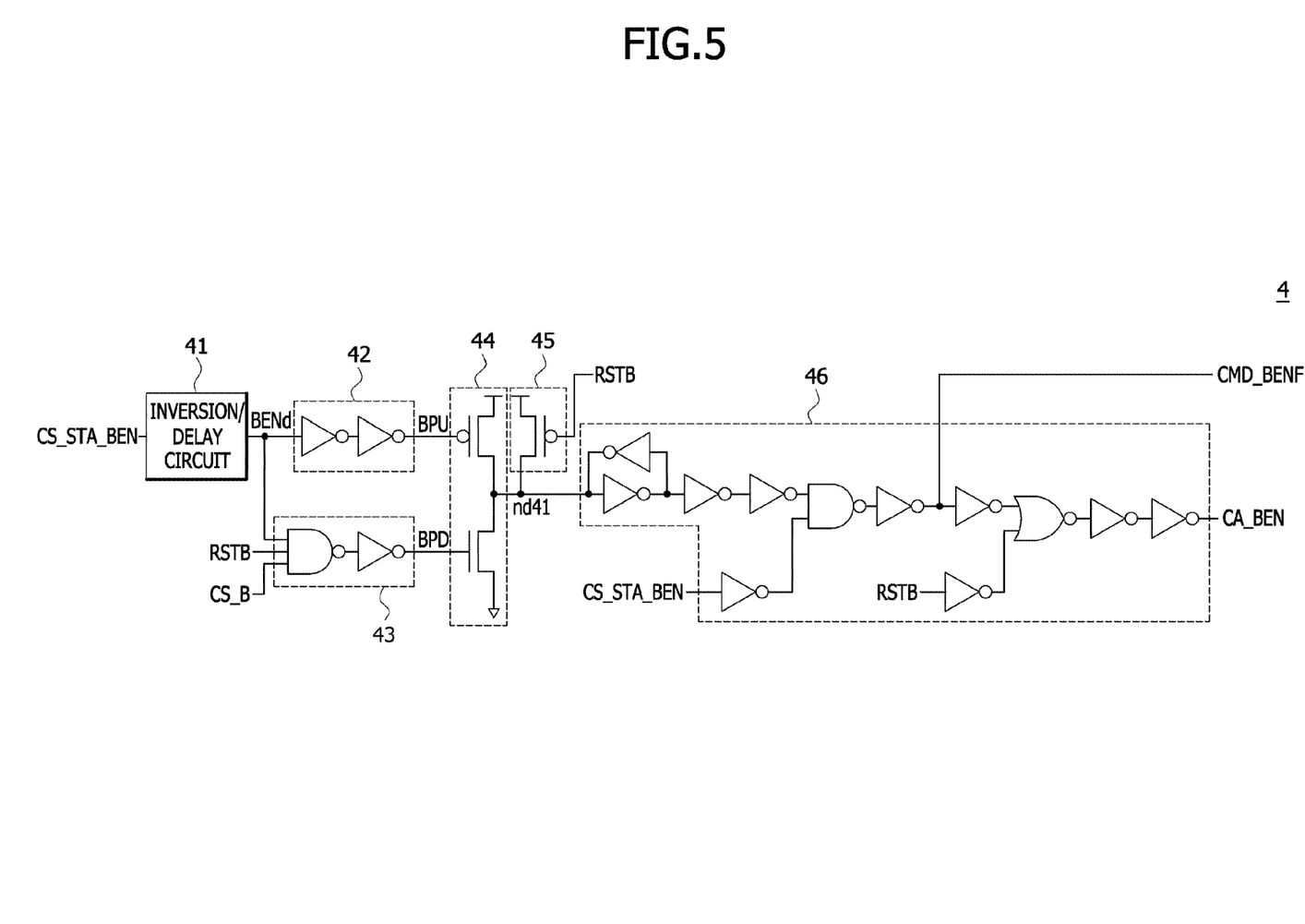
FIG. 5 is a circuit diagram illustrating an example of a command/address input control circuit included in the semiconductor device of FIG. 1.

Referring to FIG. 5, the command/address input control circuit 4 may include an inversion/delay circuit 41, a command buffer pull-up signal generation circuit 42, a command buffer pull-down signal generation circuit 43, a command buffer drive circuit 44, a command buffer initialization circuit 45, and a command buffer output circuit 46. The inversion/delay circuit 41 may invert and delay the initial buffer activation signal CS_STA_BEN to generate a delayed buffer activation signal BENd. The command buffer pull-up signal generation circuit 42 may buffer the delayed buffer activation signal BENd to generate a command buffer pull-up signal BPU. The command buffer pull-up signal generation circuit 42 may generate the command buffer pull-up signal BPU which is enabled to have a logic "low" level if the delayed buffer activation signal BENd has a logic "low" level. The command buffer pull-down signal generation circuit 43 may generate a command buffer pull-down signal BPD in response to the delayed buffer activation signal BENd, the reset signal RSTB, and the buffer signal CS_B. The command buffer pull-down signal generation circuit 43 may generate the command buffer pull-down signal BPD which is enabled to have a logic "high" level if both the delayed buffer activation signal BENd and the buffer signal CS_B have a logic "high" level while the reset signal RSTB is disabled to have a logic "high" level. The command buffer drive circuit 44 may drive a node nd41 in response to the command buffer pull-up signal BPU and the command buffer pull-down signal BPD. The command buffer drive circuit 44 may pull up a level of the node nd41 to a logic "high" level if the command buffer pull-up signal BPU is enabled to have a logic "low" level. The command buffer drive circuit 44 may pull down a level of the node nd41 to a logic "low" level if the command buffer pull-down signal BPD is enabled to have a logic "high" level. The command buffer initialization circuit 45 may initialize a level of the node nd41 in response to the reset signal RSTB. The command buffer initialization circuit 45 may initialize a level of the node nd41 to a logic "high" level if the reset signal RSTB is enabled to have a logic "low" level. The command buffer output circuit 46 may latch and delay a signal of the node nd41 by a predetermined delay period to generate the command buffer flag CMD_BENF and the command/address buffer activation signal CA_BEN, in response to the initial buffer activation signal CS_STA_BEN and the reset signal RSTB. The command buffer output circuit 46 may generate the command buffer flag CMD_BENF and the command/address buffer activation signal CA_BEN which are respectively enabled to have a logic "high" level at first and second times that two predetermined delay periods elapse from a time that a level of the node nd41 is pulled down to a logic "low" level by the command buffer pull-down signal BPD, while the reset signal RSTB is disabled to have a logic "high" level and the initial buffer activation signal CS_STA_BEN is disabled to have a logic "low" level.

The command/address input control circuit 4 may generate the command buffer flag CMD_BENF and the command/address buffer activation signal CA_BEN which are disabled to have a logic "low" level if the reset signal RSTB is enabled to have a logic "low" level to perform the initialization operation. The command/address input control circuit 4 may generate the command buffer flag CMD_BENF and the command/address buffer activation signal CA_BEN which are respectively enabled to have a logic "high" level at times that predetermined delay periods elapse from a time that the buffer signal CS_B has a logic "high" level, after the reset signal RSTB is disabled to have a logic "high" level and the initial buffer activation signal CS_STA_BEN is disabled to have a logic "low" level according to termination of the initialization operation.

Figure 6:
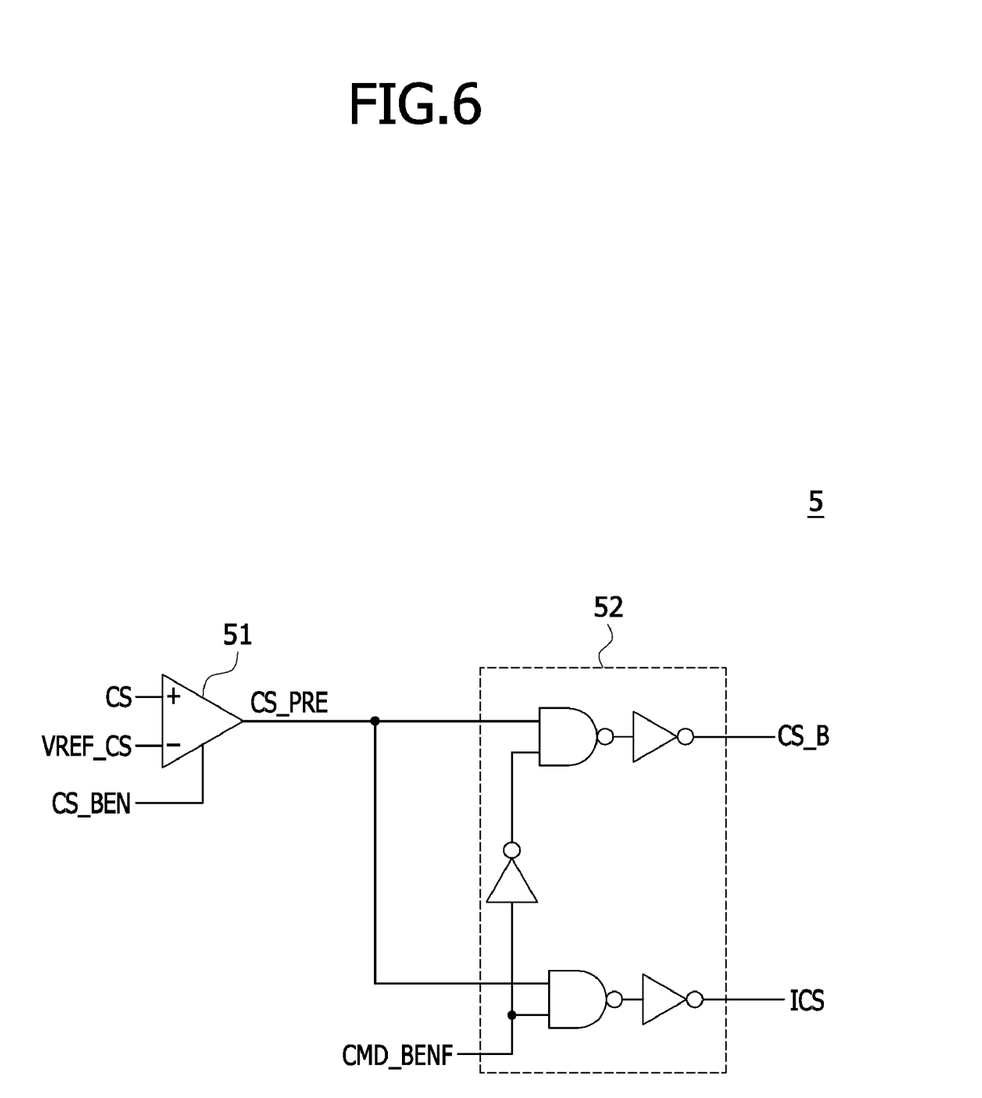
FIG. 6 is a circuit diagram illustrating an example of a buffer signal generation circuit included in the semiconductor device of FIG. 1.

Referring to FIG. 6, the buffer signal generation circuit 5 may include a buffer circuit 51, and a selection output circuit 52. The buffer circuit 51 may compare the chip selection signal CS with the chip selection reference voltage signal VREF_CS to generate a pre-chip selection signal CS_PRE, if the buffer activation signal CS_BEN is enabled to have a logic "high" level. The buffer circuit 51 may generate the pre-chip selection signal CS_PRE having a logic "high" level if the chip selection signal CS has a level which is greater than or equal to a level of the chip selection reference voltage signal VREF_CS. The buffer circuit 51 may generate the pre-chip selection signal CS_PRE having a logic "low" level if the chip selection signal CS has a level which is less than a level of the chip selection reference voltage signal VREF_CS. The buffer circuit 51 may be activated if the initial buffer signal CS_STA has a logic "high" level. The selection output circuit 52 may buffer the pre-chip selection signal CS_PRE in response to the command buffer flag CMD_BENF to generate the buffer signal CS_B and the internal chip selection signal ICS. The selection output circuit 52 may buffer the pre-chip selection signal CS_PRE to generate the buffer signal CS_B while the command buffer flag CMD_BENF is disabled to have a logic "low" level. The selection output circuit 52 may buffer the pre-chip selection signal CS_PRE to generate the internal chip selection signal ICS while the command buffer flag CMD_BENF is enabled to have a logic "high" level.

Figure 7:
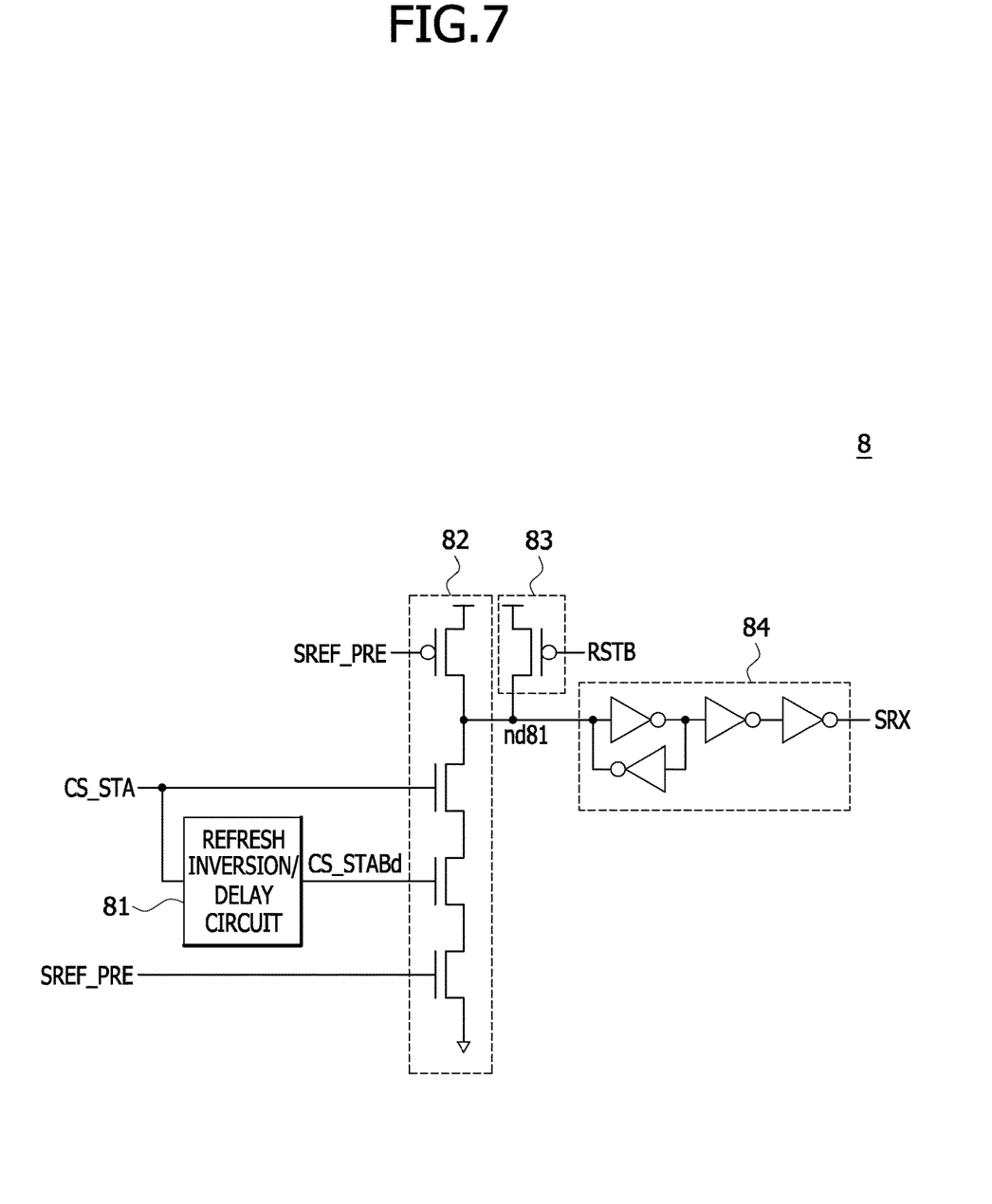
FIG. 7 is a circuit diagram illustrating an example of a refresh control circuit included in the semiconductor device of FIG. 1.

Referring to FIG. 7, the refresh control circuit 8 may include a refresh inversion/delay circuit 81, a refresh drive circuit 82, a refresh initialization circuit 83, and a refresh output circuit 84. The refresh inversion/delay circuit 81 may invert and delay the initial buffer signal CS_STA to generate an initial buffer inversion/delay signal CS_STABd. The refresh drive circuit 82 may drive a node nd81 in response to the refresh signal SREF_PRE, the initial buffer signal CS_STA, and the initial buffer inversion/delay signal CS_STABd. The refresh drive circuit 82 may pull up a level of the node nd81 to a logic "high" level if the refresh signal SREF_PRE is disabled to have a logic "low" level. The refresh drive circuit 82 may pull down a level of the node nd81 to a logic "low" level if the initial buffer signal CS_STA has a logic "high" level while the refresh signal SREF_PRE is enabled to have a logic "high" level and the initial buffer inversion/delay signal CS_STABd has a logic "high" level. The refresh initialization circuit 83 may initialize a level of the node nd81 in response to the reset signal RSTB. The refresh initialization circuit 83 may initialize a level of the node nd81 to a logic "high" level if the reset signal RSTB is enabled to have a logic "low" level. The refresh output circuit 84 may latch and inversely buffer a signal of the node nd81 to generate the refresh exit signal SRX. The refresh output circuit 84 may inversely buffer a signal of the node nd81, which is pulled down to have a logic "low" level, to generate the refresh exit signal SRX which is enabled to have a logic "high' level.

The refresh control circuit 8 may generate the refresh exit signal SRX which is disabled to have a logic "low" level if the reset signal RSTB is enabled to have a logic "low" level for execution of the initialization operation. The refresh control circuit 8 may generate the refresh exit signal SRX which is disabled to have a logic "low" level while the refresh signal SREF_PRE is disabled to have a logic "low" level so that the refresh operation is not performed. The refresh control circuit 8 may generate the refresh exit signal SRX which is enabled to have a logic "high" level if the chip selection signal CS has a level which is greater than or equal to a level of the initial reference voltage signal VREF_S to change a level of the initial buffer signal CS_STA into a logic "high" level while the refresh signal SREF_PRE is enabled to have a logic "high" level to perform the refresh operation.

Operations of the semiconductor device having the aforementioned configuration will be described hereinafter with reference to FIGS. 8 and 9.

Figure 8:
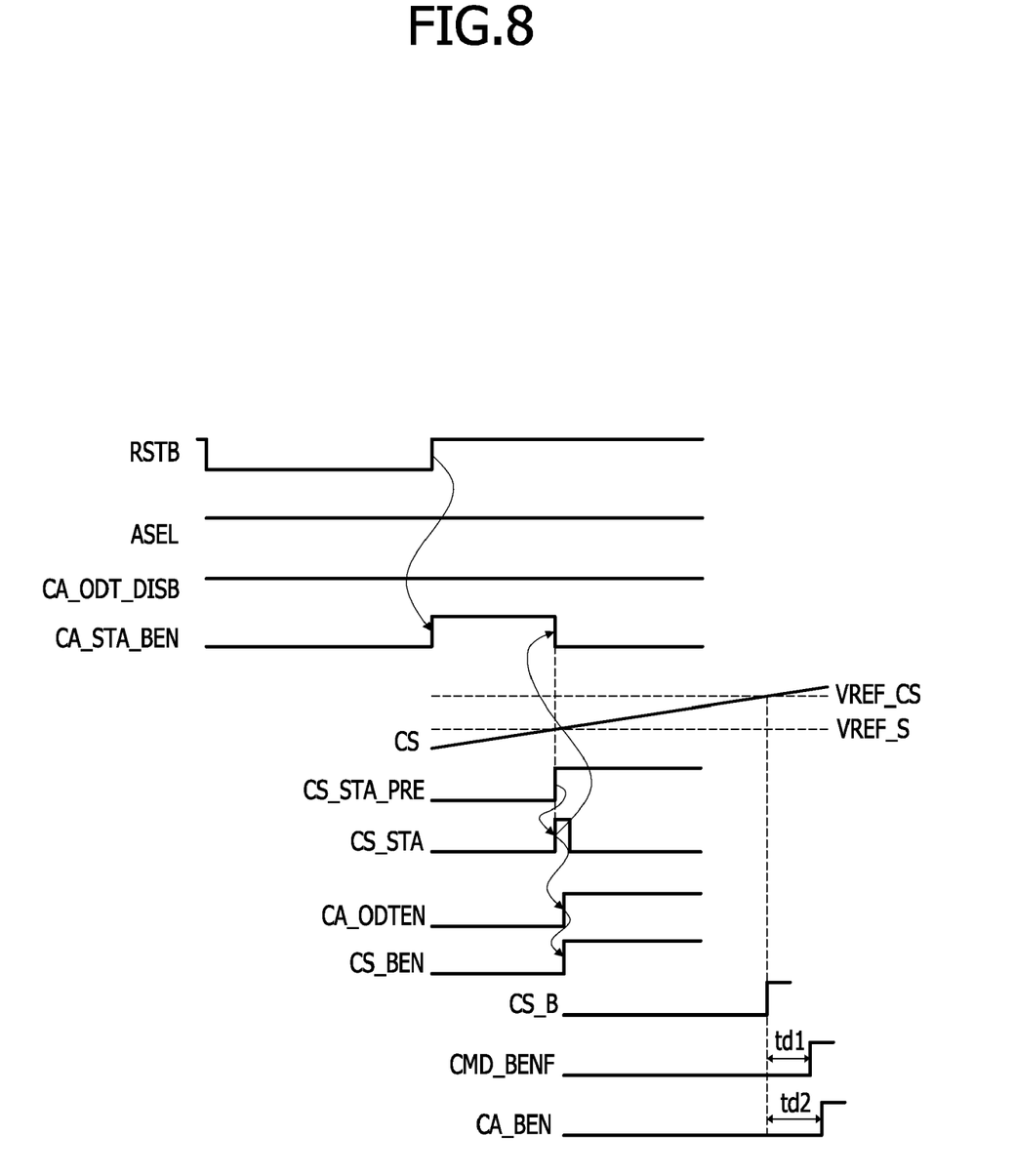
FIGS. 8 and 9 are timing diagrams illustrating operations of the semiconductor device shown in FIGS. 1 to 7.

Referring to FIG. 8, while the activation selection signal ASEL is generated to have a logic "high" level and the termination control signal CA_ODT_DISB is disabled to have a logic "high" level because the refresh operation is not performed, the semiconductor device may operate as follows. The initial buffer activation signal CS_STA_BEN may be enabled to have a logic "high" level in synchronization with a time that a level transition of the reset signal RSTB occurs from a logic "low" level to a logic "high" level as the initialization operation terminates, thereby activating the initial buffer circuit 21. If the chip selection signal CS has a level which is greater than or equal to a level of the initial reference voltage signal VREF_S, a level transition of the pre-initial buffer signal CS_STA_PRE and the initial buffer signal CS_STA may occur from a logic "low" level to a logic "high" level. The termination activation signal CA_ODTEN and the buffer activation signal CS_BEN may be enabled to have a logic "high" level in synchronization with a time that the initial buffer signal CS_STA transitions from a logic "low" level to a logic "high" level. If the termination activation signal CA_ODTEN is enabled, the termination resistor circuit 7 connected to an input terminal of the command/address CA may be activated. If the buffer activation signal CS_BEN is enabled, the buffer circuit 51 may be activated. A transition of the buffer signal CS_B may occur from a logic "low" level to a logic "high" level in synchronization with a time that the chip selection signal CS has a level which is greater than or equal to a level of the chip selection reference voltage signal VREF_CS. At a time that a first delay period td1 elapses from a time that a level of the buffer signal CS_B transition occurs from a logic "low" level to a logic "high" level, the command buffer flag CMD_BENF may be enabled to have a logic "high" level to generate an internal command including the internal chip selection signal ICS. At a time that a second delay period td2 elapses from a time that a level of the buffer signal CS_B transition occurs from a logic "low" level to a logic "high" level, the command/address buffer activation signal CA_BEN may be enabled to have a logic "high" level to activate the command/address buffer 6.

The semiconductor device according to an embodiment may control activation or inactivation of the initial buffer circuit 21 and the buffer circuit 51, which receive the chip selection signal CS, according to levels of the reset signal RSTB and the chip selection signal CS. That is, the semiconductor device according to an embodiment may activate the initial buffer circuit 21 if the reset signal RSTB is disabled to terminate the initialization operation, and the semiconductor device may inactivate the initial buffer circuit 21 and may activate the buffer circuit 51 and the termination resistor circuit 7 if the chip selection signal CS inputted through the initial buffer circuit 21 has a level which is greater than or equal to a level of the initial reference voltage signal VREF_S. If the chip selection signal CS inputted through the buffer circuit 51 has a level which is greater than or equal to a level of the chip selection reference voltage signal VREF_CS, the command/address buffer 6 may be activated after a predetermined delay period elapses from a time that the chip selection signal CS has a level which is equal to a level of the chip selection reference voltage signal VREF_CS. The semiconductor device according to an embodiment may stably control activation moments of the initial buffer circuit 21, the buffer circuit 51, and the command/address buffer 6 according to logic levels of the reset signal RSTB and the chip selection signal CS.

Figure 9:
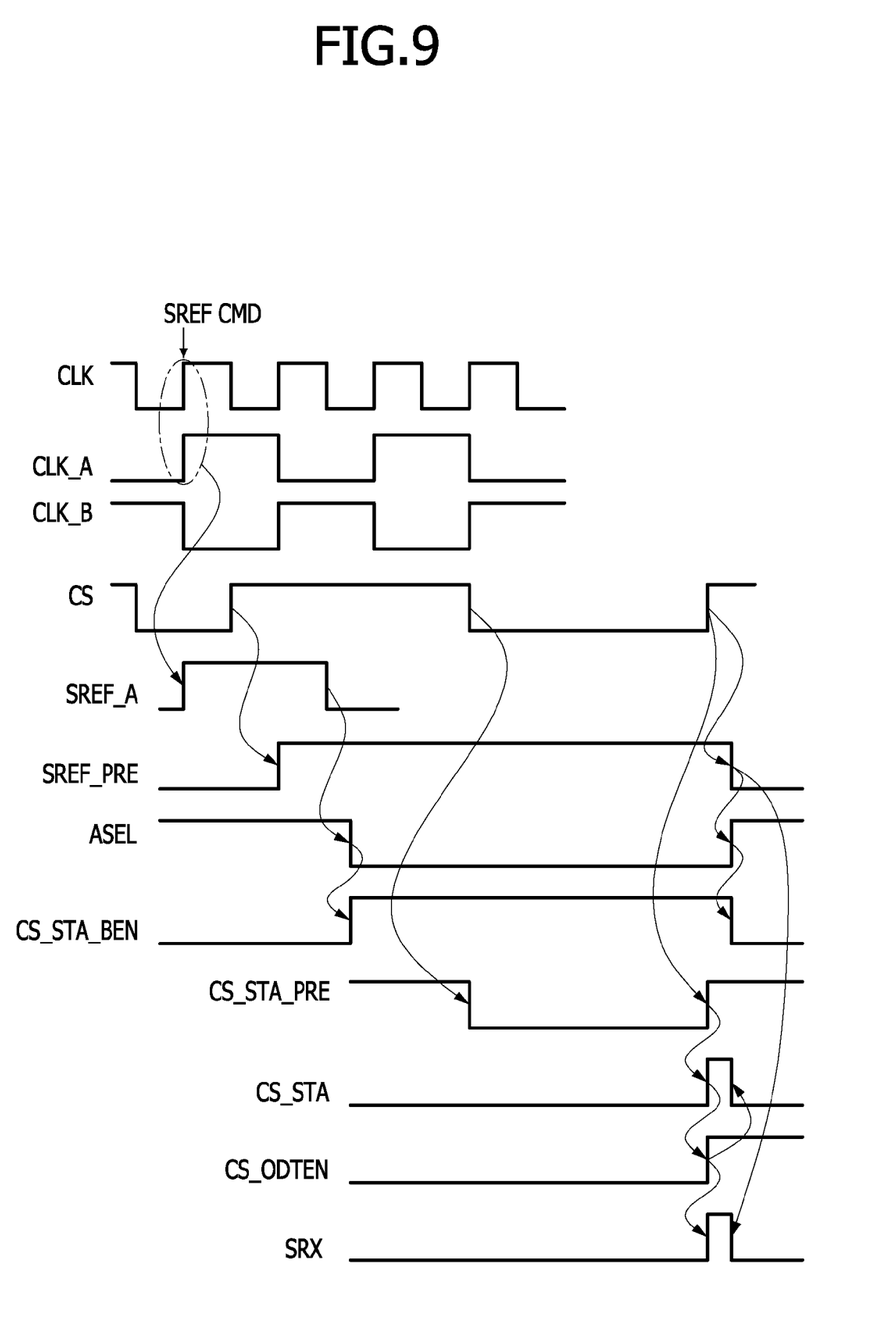

Referring to FIG. 9, if the self-refresh operation is performed while a first division clock signal CLK_A and a second division clock signal CLK_B are generated from a clock signal CLK, the semiconductor device may operate as follows. The first and second division clock signals CLK_A and CLK_B may be generated by dividing a frequency of the clock signal CLK to have a cycle time which is twice a cycle time of the clock signal CLK. The first and second division clock signals CLK_A and CLK_B may be generated to have opposite phases than each other. If a self-refresh command SREF_CMD for a refresh operation is inputted in synchronization with the first division clock signal CLK_A, the first refresh pulse SREF_A may be created. If a transition level of the chip selection signal CS occurs from a logic "low" level to a logic "high" while the first refresh pulse SREF_A is created, the refresh signal SREF_PRE may be enabled to have a logic "high" level. The activation selection signal ASEL may be generated to have a logic "low" level and the initial buffer activation signal CS_STA_BEN may be enabled to have a logic "high" level to activate the initial buffer circuit 21, in synchronization with a time that creation of the first refresh pulse SREF_A terminates while the refresh signal SREF_PRE maintains a logic "high" level. If the chip selection signal CS has a level which is greater than or equal to a level of the initial reference voltage signal VREF_S after the creation of the first refresh pulse SREF_A terminates, a transition level of the pre-initial buffer signal CS_STA_PRE and the initial buffer signal CS_STA may occur from a logic "low" level to a logic "high" level. Both the termination activation signal CA_ODTEN and the refresh exit signal SRX may be enabled to have a logic "high" level in synchronization with a time that a transition level of the initial buffer signal CS_STA occurs from a logic "low" level to a logic "high" level. After a transition level of the chip selection signal CS occurs from a logic "low" level to a logic "high" level, the refresh signal SREF_PRE may be disabled to have a logic "low" level and a transition level of the activation selection signal ASEL may occur from a logic "low" level to a logic "high" level to disable the initial buffer activation signal CS_STA_BEN to a logic "low" level.

The semiconductor device according to an embodiment may control an exit moment of a self-refresh operation according to a level of the chip selection signal CS if the self-refresh operation is performed in a power-down mode. That is, the semiconductor device according to an embodiment may control a time that the self-refresh exit signal SRX can be stably generated by the chip selection signal CS without any glitch. Accordingly, a self-refresh exit operation may be stably performed after the power-down mode terminates.

Figure 10:
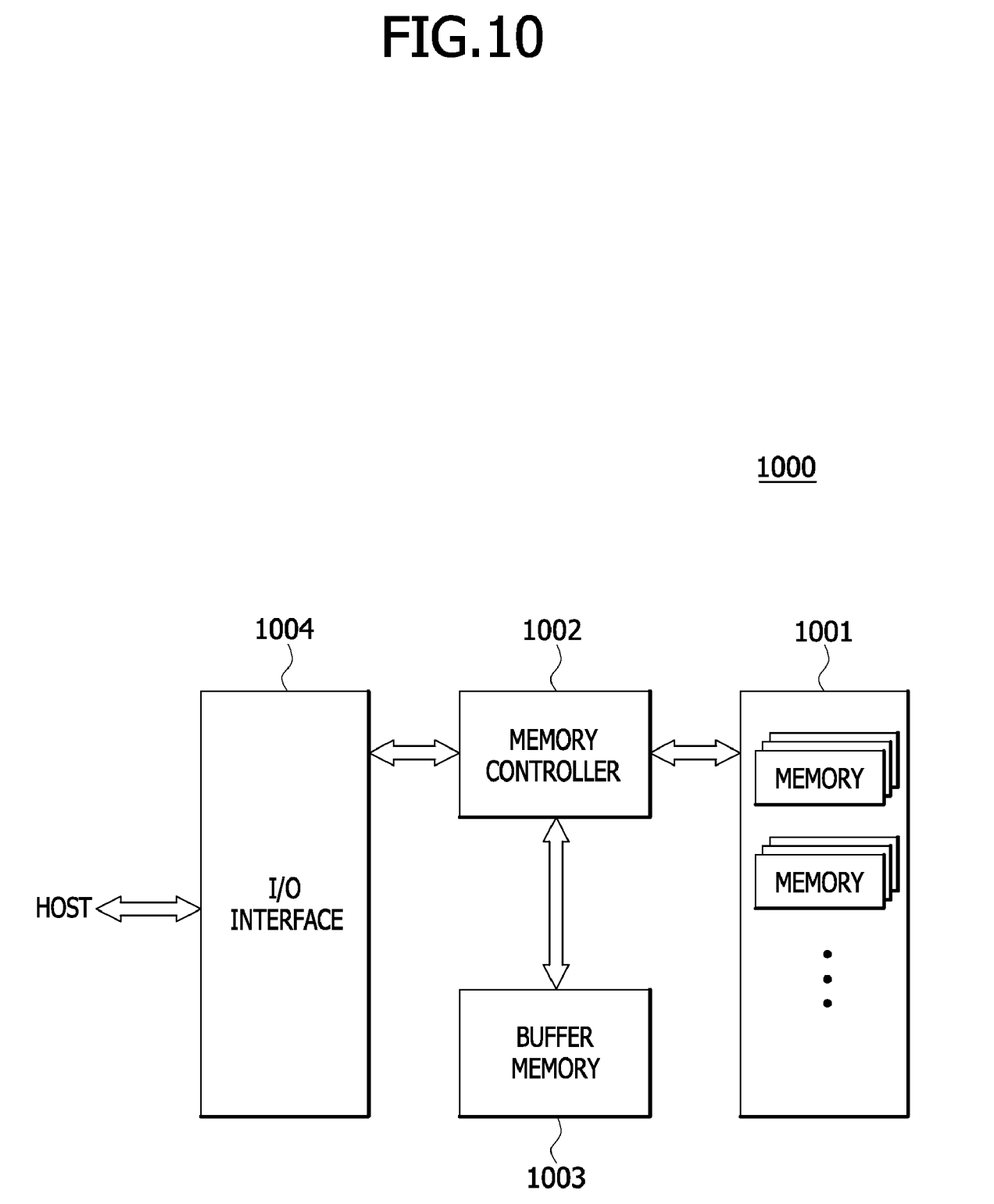
FIG. 10 is a block diagram illustrating a configuration of an electronic system including the semiconductor device shown in FIG. 1.

The semiconductor device described with reference to FIGS. 1 to 9 may be applied to an electronic system that includes a memory system, a graphic system, a computing system, a mobile system, or the like. For example, as illustrated in FIG. 10, an electronic system 1000 according an embodiment may include a data storage unit 1001, a memory controller 1002, a buffer memory 1003, and an input/output (I/O) interface 1004.

The data storage unit 1001 may store data which is outputted from the memory controller 1002 or may read and output the stored data to the memory controller 1002, according to a control signal generated by the memory controller 1002. The data storage unit 1001 may include the semiconductor device illustrated in FIG. 1. Meanwhile, the data storage unit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage unit 1001 or the buffer memory 1003, or for outputting the data stored in the data storage unit 1001 or the buffer memory 1003. Although FIG. 10 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data which is processed by the memory controller 1002. That is, the buffer memory 1003 may temporarily store the data which is outputted from or to be inputted to the data storage unit 1001. The buffer memory 1003 may store the data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
an initial buffer signal generation circuit configured to include an initial buffer circuit which is activated if an initialization operation terminates and configured to generate an initial buffer signal from an external control signal in response to a first reference voltage signal; and
a buffer signal generation circuit configured to include a buffer circuit which is activated in response to the initial buffer signal and configured to generate a buffer signal from the external control signal in response to a second reference voltage signal;
wherein the initial buffer signal has a first logic level if the external control signal has a level which is greater than or equal to a level of the first reference voltage signal, and wherein the initial buffer signal has a second logic level if the external control signal has a level which is less than the level of the first reference voltage signal.

2. The semiconductor device of claim 1, wherein the external control signal is a chip selection signal which is enabled to activate a chip including the semiconductor device.

3. The semiconductor device of claim 1, wherein the initial buffer circuit is inactivated in response to the initial buffer signal.

4. The semiconductor device of claim 1,
wherein the first reference voltage signal has a half level of a power supply voltage which is provided by an external device; and
wherein the second reference voltage signal has a same level as the power supply voltage.

5. The semiconductor device of claim 1,
wherein the initial buffer circuit is inactivated if the initial buffer signal has the first logic level; and
wherein the buffer circuit is activated if the initial buffer signal has the first logic level.

6. The semiconductor device of claim 1,
wherein the initial buffer circuit compares the external control signal with the first reference voltage signal to generate a pre-initial buffer signal, in response to an initial buffer activation signal; and
wherein the initial buffer signal generation circuit further includes:
a buffer control signal generation circuit configured to generate a buffer control signal from a signal of a node which is driven in response to a reset signal and a termination activation signal; and an initial buffer signal output circuit configured to generate the initial buffer signal in response to the pre-initial buffer signal and the buffer control signal.

7. The semiconductor device of claim 6, wherein the initial buffer activation signal is enabled if the initialization operation terminates.

8. The semiconductor device of claim 6,
wherein the reset signal is enabled to perform the initialization operation;
wherein the termination activation signal is enabled if the external control signal has a level which is greater than or equal to a level of the first reference voltage signal; and
wherein the buffer control signal is enabled if both the reset signal and the termination activation signal are disabled.

9. The semiconductor device of claim 1,
wherein the buffer circuit compares the external control signal with the second reference voltage signal in response to a buffer activation signal; and
wherein the buffer signal generation circuit further includes a selection output circuit that buffers an output signal of the buffer circuit to selectively output the buffer signal in response to a command buffer flag.

10. The semiconductor device of claim 1, further comprising a buffer control circuit configured to receive the initial buffer signal to generate a termination activation signal for activating a termination resistor circuit connected to a command/address buffer and to generate a buffer activation signal for activating the buffer circuit.

11. The semiconductor device of claim 1, further comprising a command/address input control circuit configured to generate a command/address buffer activation signal for controlling activation or inactivation of a command/address buffer in response to an initial buffer activation signal, a reset signal and the buffer signal.

12. The semiconductor device of claim 1, further comprising a refresh control circuit configured to generate a refresh exit signal in response to the initial buffer signal and a refresh signal.

13. The semiconductor device of claim 12, wherein the refresh exit signal is enabled if the external control signal has a level which is greater than or equal to a level of the first reference voltage signal to cause a level transition of the initial buffer signal, while a refresh signal is enabled to perform a refresh operation.

14. A semiconductor device comprising:
a buffer signal generation circuit configured to include a buffer circuit which is activated in response to an initial buffer signal which is generated by comparing an external control signal with a first reference voltage signal if an initialization operation terminates and configured to generate a buffer signal from the external control signal in response to a second reference voltage signal; and
a command/address input control circuit configured to generate a command/address buffer activation signal for controlling activation or inactivation of a command/ address buffer in response to the buffer signal;
wherein the initial buffer signal has a first logic level if the external control signal has a level which is greater than or equal to a level of the first reference voltage signal, and wherein the initial buffer signal has a second logic level if the external control signal has a level which is less than the level of the first reference voltage signal.

15. The semiconductor device of claim 14, wherein the external control signal is a chip selection signal which is enabled to activate a chip including the semiconductor device.

16. The semiconductor device of claim 14,
wherein the first reference voltage signal has a half level of a power supply voltage which is provided by an external device; and
wherein the second reference voltage signal has a same level as the power supply voltage.

17. The semiconductor device of claim 14, wherein the buffer circuit is activated if the initial buffer signal has the first logic level.

18. The semiconductor device of claim 14,
wherein the buffer signal has a first logic level if the external control signal has a level which is greater than or equal to a level of the second reference voltage signal; and
wherein the buffer signal has a second logic level if the external control signal has a level which is less than the level of the second reference voltage signal.

19. The semiconductor device of claim 18, wherein the command/address buffer activation signal is enabled if the buffer signal has the first logic level.

20. The semiconductor device of claim 14, further comprising a buffer control circuit configured to receive the initial buffer signal to generate a termination activation signal for activating a termination resistor circuit connected to the command/address buffer and to generate a buffer activation signal for activating the buffer circuit.

21. A semiconductor device comprising:
an initial buffer signal generation circuit configured to include an initial buffer circuit which is activated if an initialization operation terminates and configured to generate an initial buffer signal from an external control signal in response to a reference voltage signal; and
a refresh control circuit configured to generate a refresh exit signal in response to the initial buffer signal and a refresh signal;
wherein the initial buffer signal has a first logic level if the external control signal has a level which is greater than or equal to a level of the reference voltage signal, and
wherein the initial buffer signal has a second logic level if the external control signal has a level which is less than the level of the reference voltage signal.

22. The semiconductor device of claim 21, wherein the external control signal is a chip selection signal which is enabled to activate a chip including the semiconductor device.

23. The semiconductor device of claim 21, wherein the initial buffer circuit is inactivated if the initial buffer signal has the first logic level.

24. The semiconductor device of claim 21,
wherein the initial buffer circuit compares the external control signal with the reference voltage signal to generate a pre-initial buffer signal, in response to an initial buffer activation signal; and
wherein the initial buffer signal generation circuit further includes:
a buffer control signal generation circuit configured to generate a buffer control signal from a signal of a node which is driven in response to a reset signal and a termination activation signal; and
an initial buffer signal output circuit configured to generate the initial buffer signal in response to the pre-initial buffer signal and the buffer control signal.

25. The semiconductor device of claim 24, wherein the initial buffer activation signal is enabled if the initialization operation terminates.

26. The semiconductor device of claim 24,
wherein the reset signal is enabled to perform the initialization operation;
wherein the termination activation signal is enabled if the external control signal has a level which is greater than or equal to a level of the reference voltage signal; and
wherein the buffer control signal is enabled if both the reset signal and the termination activation signal are disabled.

27. The semiconductor device of claim 21, wherein the refresh exit signal is enabled if the external control signal has a level which is greater than or equal to a level of the reference voltage signal to cause a level transition of the initial buffer signal, while the refresh signal is enabled to perform a refresh operation.

* * * * *